(12) United States Patent
Schoen et al.

(10) Patent No.: US 7,649,349 B2
(45) Date of Patent: Jan. 19, 2010

(54) METHOD FOR THE MANUFACTURE OF A SWITCHING DEVICE AND MODULE FOR A SWITCHING DEVICE

(75) Inventors: Dierk Schoen, Egelsbach (DE); Dionysios Divaris, Griesheim (DE)

(73) Assignee: Pepperl + Fuchs GmbH, Mannheim (DE)

( * ) Notice: Subject to any disclaimer, the term of this patent is extended or adjusted under 35 U.S.C. 154(b) by 344 days.

(21) Appl. No.: 10/596,567

(22) PCT Filed: Dec. 6, 2004

(86) PCT No.: PCT/EP2004/013874

§ 371 (c)(1),
(2), (4) Date: May 8, 2007

(87) PCT Pub. No.: WO2005/064278

PCT Pub. Date: Jul. 14, 2005

(65) Prior Publication Data

US 2007/0217179 A1   Sep. 20, 2007

(30) Foreign Application Priority Data

Dec. 19, 2003   (DE) ................................ 103 59 885

(51) Int. Cl.
*G01P 3/42* (2006.01)
*H01L 29/772* (2006.01)

(52) U.S. Cl. ..................... 324/173; 73/514.39; 257/414

(58) Field of Classification Search .................. 324/173, 324/179, 207.15, 207.2, 207.21, 249, 251, 324/252, 253, 658, 684; 73/514.39; 257/414, 257/422, 433, 435

See application file for complete search history.

(56) References Cited

U.S. PATENT DOCUMENTS

| | | | |
|---|---|---|---|
| 5,627,325 A * | 5/1997 | Lew et al. ................. | 73/861.56 |
| 6,025,562 A | 2/2000 | Shimizu et al. | |
| 6,617,845 B1 | 9/2003 | Shafiyan-Rad et al. | |
| 7,081,661 B2 * | 7/2006 | Takehara et al. ............ | 257/433 |

FOREIGN PATENT DOCUMENTS

| | | |
|---|---|---|
| DE | 8805837 U1 | 6/1988 |
| DE | 19808153 A1 | 6/2006 |
| FR | 2620222 A1 | 3/1989 |

OTHER PUBLICATIONS

PCT, "International Preliminary Report on Patentability", International Application No. PCT/EP2004/013874, International Filing Date Dec. 6, 2004, pp. 1-5.

* cited by examiner

*Primary Examiner*—Kenneth J Whittington
(74) *Attorney, Agent, or Firm*—John A. Merecki; Hoffman Warnick LLC

(57) ABSTRACT

The invention relates to a method for the manufacture of a switching device with a sensor unit located at a measurement end of a casing sleeve and connected to an electronic circuit located on a support received in the casing sleeve, and with a connection part located at a rear end of the casing sleeve. The method is characterized in that the sensor unit, support and connection part together with a shielding sleeve surrounding the support are assembled to form a dimensionally stable module and the latter is subsequently inserted in the casing sleeve, where it is received in fixing manner. According to a further aspect, the invention relates to a module for a switching device.

31 Claims, 8 Drawing Sheets

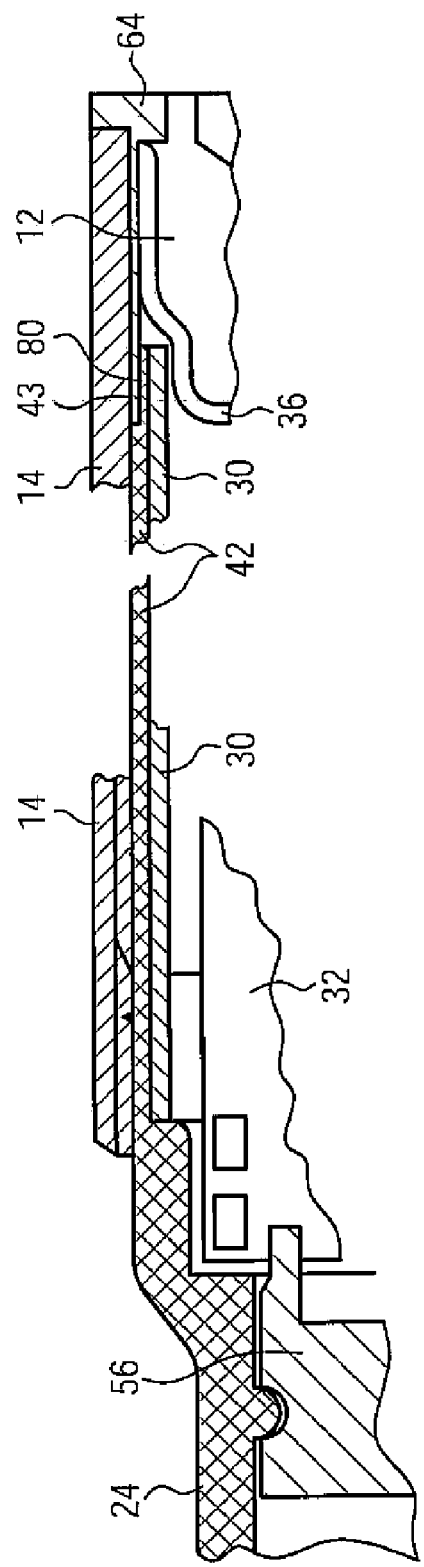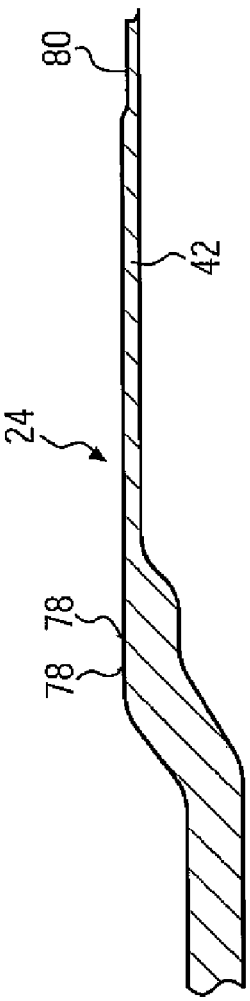

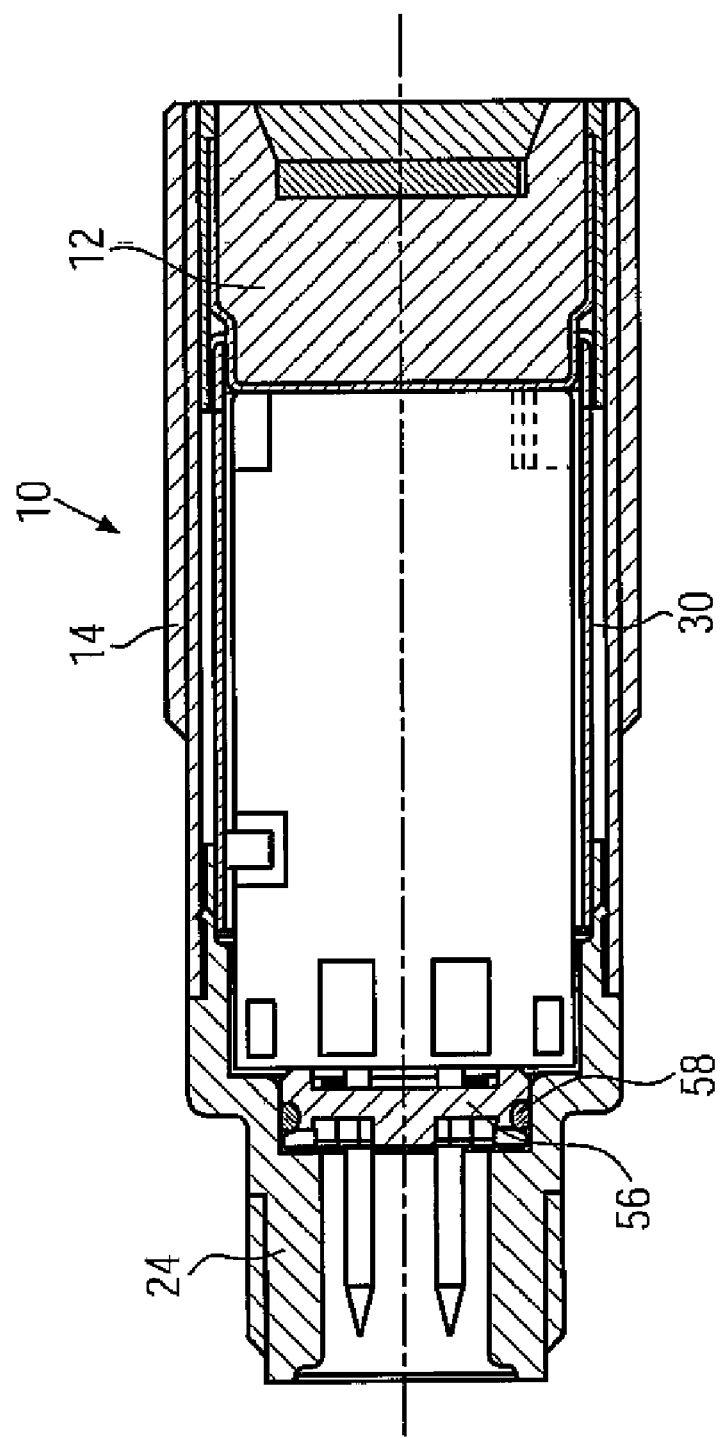

Figure 1:
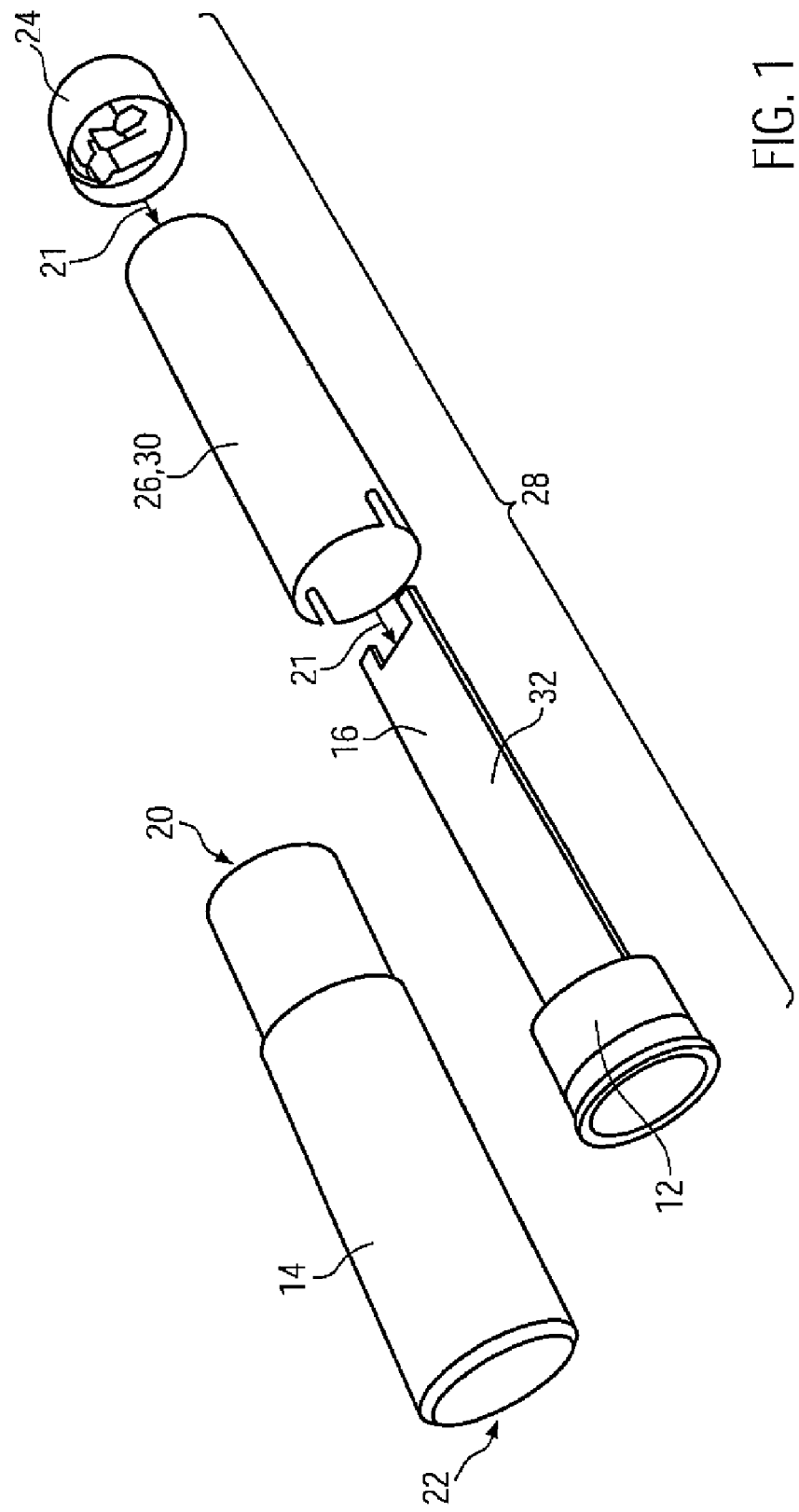

METHOD FOR THE MANUFACTURE OF A SWITCHING DEVICE AND MODULE FOR A SWITCHING DEVICE

In a first aspect the invention relates to a method for the manufacture of a switching device. In a further aspect the invention relates to a module for a switching device.

A preamble-based method for the manufacture of a switching device having a sensor unit located at a measurement end of a casing sleeve and connected to an electronic circuit which is located on a support received in the casing sleeve, and having a connection part located at a rear end of the casing sleeve is described in DE 100 13 218 C2. Although the switching device therein is assembled in a single operation method, a separate centring piece is required for the exact positioning and has to be separately inserted prior to curing of a moulding compound introduced into the casing in order to bring about a precise orientation of the measurement end with the sensor.

A switching device of the aforementioned type in which the coverage range of a sensor runs angularly to the longitudinal axis is described in DE 201 06 871 U1.

A further single operation assembly method forms the subject matter of DE 195 04 608 C2. There again for the orientation of the measurement end it is necessary to have a separate centring piece to be introduced into the casing sleeve.

Further methods which cannot be performed in a single operation and which are therefore comparatively complicated and costly are disclosed in DE 195 44 815 C1 and DE 101 53 489 A1.

A method for the manufacture of a proximity switch with fastening sleeve is described in DE 40 23 792 C2. Components held on a board, including a sensor are embedded in plastic and initially the sensor is brought into contact with the board and then the sensor is moulded in a pot. In order to permit plastic embedding without interrupting the manufacturing cycle, it is proposed that following onto the same the pot, board and a cable connected thereto are jointly moulded in a mould to form a unit which is finally inserted in the fastening sleeve.

DE 295 22 086 U1 relates to an electrical or electronic device, particularly a proximity switch. To permit simpler manufacture, it is proposed that use is made of a casing manufactured in die cast method.

Further proximity switches and methods for their manufacture are described in U.S. Pat. No. 6,025,562, DE 198 08 153 A1 and DE 92 10 480.0 U1.

The object of the present invention is to provide a method for the manufacture of a switching device which can be performed particularly simply in addition, a module for a switching device is to be provided.

Advantageous variants of the method and module according to the invention form the subject matter of the subclaims.

The method of the aforementioned type is inventively further developed in that the sensor unit, support and connection part together with a shielding sleeve surrounding the support are assembled to form a dimensionally stable module, which is then introduced into the casing sleeve where it is received in fixing manner.

The inventive module for a switching device for installation in a casing sleeve has the following components: a sensor unit with a sensor for the detection of a measuring signal, an electronic circuit located on a support, in which at least one end, advantageously at a measurement end, the support is connected in dimensionally stable manner to the sensor unit and in which the circuit is electrically connected to the sensor unit, a shielding sleeve surrounding, particularly coaxially, the support and which is connected in dimensionally stable manner to the sensor unit and/or the support, and a connection part which is in particular also coaxial to the aforementioned components for the connection of the circuit to external devices and/or terminals, which is mounted on the support and/or on the shielding sleeve.

It is a fundamental concept of the invention that a module is formed from the sensor unit, support and connection part, together with a shielding surrounding the support and more particularly a shielding sleeve and said module is subsequently introduced into a casing. According to a further fundamental concept in this context the components used are constructed in such a way that during assembly, which in the simplest case is merely a plugging together, the correct relative positioning of the components with respect to one another is obtained substantially automatically.

According to a further fundamental concept the indicated components are also shaped and constructed in such a way that during insertion into the casing the module is received in fixing manner therein.

This makes it possible to achieve the essential advantage of the method according to the invention, that following the insertion of the subassembly into the casing sleeve no further measures are required for centring and orienting the components. As the method is substantially completed in a single operation, it can be performed very inexpensively. However, highly precise switching devices can still be manufactured. In all the manufacturing safety and efficiency can be increased.

In a particularly preferred variant of the method the module is introduced into the casing sleeve from the measurement end. Thus, in conjunction with the module already assembled with a precise orientation and which can also be referred to as an intermediate module, a particularly precise mutual orientation of the components is possible.

However, it is fundamentally also possible to insert the module into the casing sleeve from the rear end of the latter. Thus, the method can be performed in a particularly versatile manner. In particular, the method can be performed independently of any sensor unit orientation.

The method according to the invention makes it possible to manufacture both axially oriented and angular converters, transducers or switching devices.

Particularly robust switching devices can be manufactured simply if the module is introduced in sealing manner into the casing sleeve. Appropriately, for this purpose on the module and/or on the casing sleeve there are suitable sealing devices, such as e.g. sealing lips, and/or beads and corresponding grooves and/or seals with separate sealing elements, and/or advantageously and in the case of an adequate casing sleeve diameter O-rings. A switching device manufactured in this way can be used in a particularly versatile manner, particularly also in environments where moisture and/or aggressive fluids act on the switching device, e.g. in machine tools.

The manufacture of the inventive module and the inventive manufacturing method are made particularly simple on using a cylindrical shielding sleeve and a cylindrical casing sleeve. These components can be inexpensively manufactured in house or if necessary can be bought in. The shielding sleeve is appropriately electrically contacted with the support and/or with the electronic circuit on the support. Electrical contacting can in particular be such that this also leads to a mechanical stabilization. Appropriately, for this purpose the shielding sleeve has one or more contact tabs at random locations on the shielding sleeve circumference.

The support is preferably constituted by a printed circuit board, which is brought into aligned engagement with the sensor unit. The printed circuit board is subsequently electrically connected to the sensor unit. Thus, with simple measures, a clearly defined mutual orientation of the components is obtained. The electrical contacting between the printed circuit board and the sensor unit can additionally bring about a mechanical stabilization. A clearly defined mutual orientation of the components is also preferably achieved in that the shielding, surrounding the support, is, in a defined manner, brought into abutment with the self-centring, cylindrical sensor unit.

It is also appropriate in this connection if the connection part is brought into clearly defined orientation with the support on a terminal area of the shielding sleeve.

The stability, resistance to external influences, such as e.g. moisture and/or aggressive fluids, and the electrical safety of the switching device are also improved if the areas between the support and the shielding sleeve and/or between the shielding sleeve and the casing sleeve are moulded and/or extruded.

Such a moulding can be performed particularly simply through openings in the connection part.

Such moulding takes place following the assembly of the switching device. To prevent bubble formation in the vicinity of a transparent connection part and an associated impairing of the optical characteristics through additional interfaces during moulding, it can be appropriate in connection with the module to perform in the connection part a premoulding with a material which is transparent and/or semitransparent after curing.

A higher electrical protection class can be achieved if use is made of a connection part with an elongated collar, which is engaged over the shielding sleeve and brought into abutment with the sensor unit. This collar preferably fills the space between the shielding sleeve and the casing sleeve in a substantially complete manner. A moulding of this area is then no longer necessary and consequently the associated lack of reliability can be avoided. A switching device manufactured in this way is also able to achieve insulation protection class 2.

In the case of sensors, where a need for a suitable shielding of the sensor unit with respect to interfering electromagnetic radiation is necessary, the shielding, before being connected to the circuit on the printed circuit board, is inserted in a centring, cup-like shielding bush. Otherwise a similar component is used for centring the shielding sleeve.

On said shielding bush are appropriately provided contact Labs which are soldered to the printed circuit board. Mechanical stabilization can be again brought about by such contact tabs.

The sensor can e.g. be an inductive, optical, capacitive, temperature, pressure and/or gas sensor. The switching device can in particular be a proximity switch.

Further advantages and characteristics of the method and module according to the invention are described in greater detail hereinafter relative to the attached diagrammatic drawings, wherein show:

FIG. 1A diagrammatic, exploded representation of the inventive module together with a casing sleeve.

Figure 2:
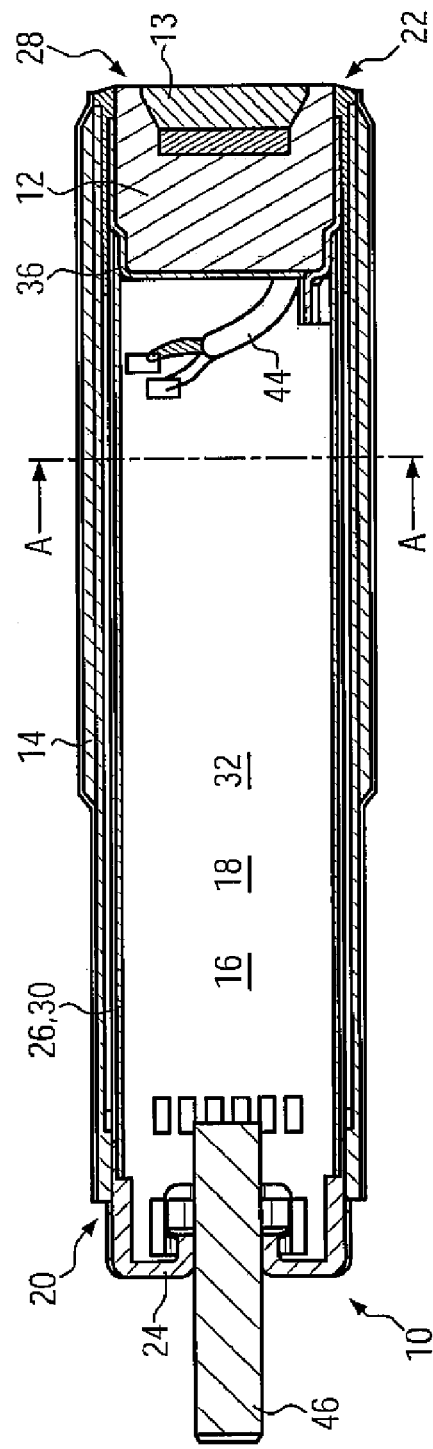
Figure 3:
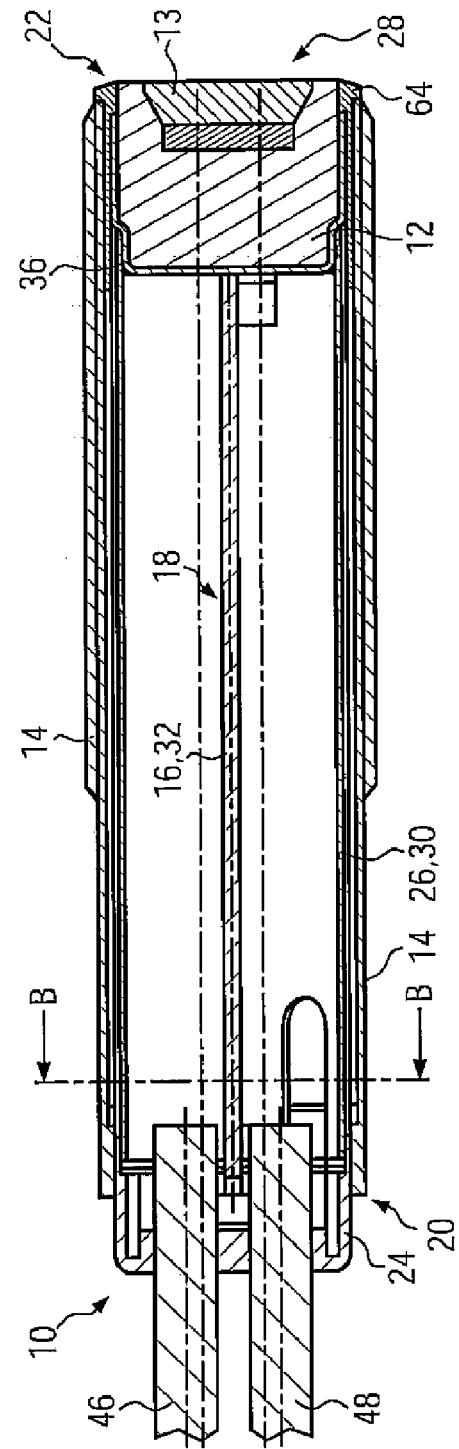

FIGS. 2 & 3 Longitudinal sectional views of an embodiment of an inventively manufactured switching device with single operation assembly from the measured end with a connection part in a version for cables.

Figure 4:
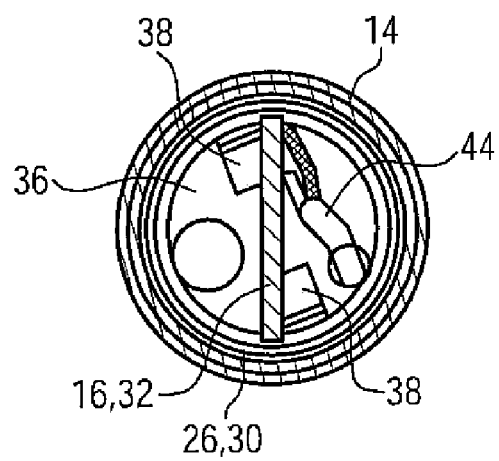

FIG. 4 A sectional view along line A-A of FIG. 2.

Figure 5:
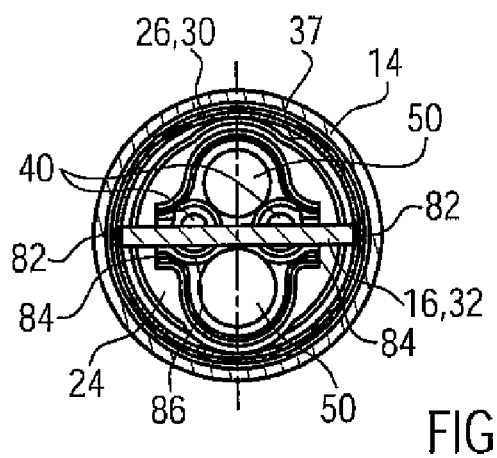

FIG. 5 A sectional view along line B-B of FIG. 3.

Figure 6:
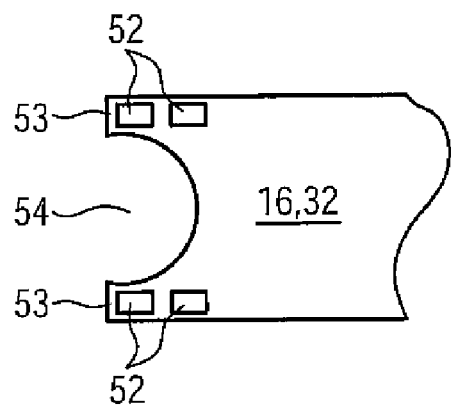

FIG. 6 A detail of a printed circuit board in a switching device manufactured according to the invention.

Figure 7:
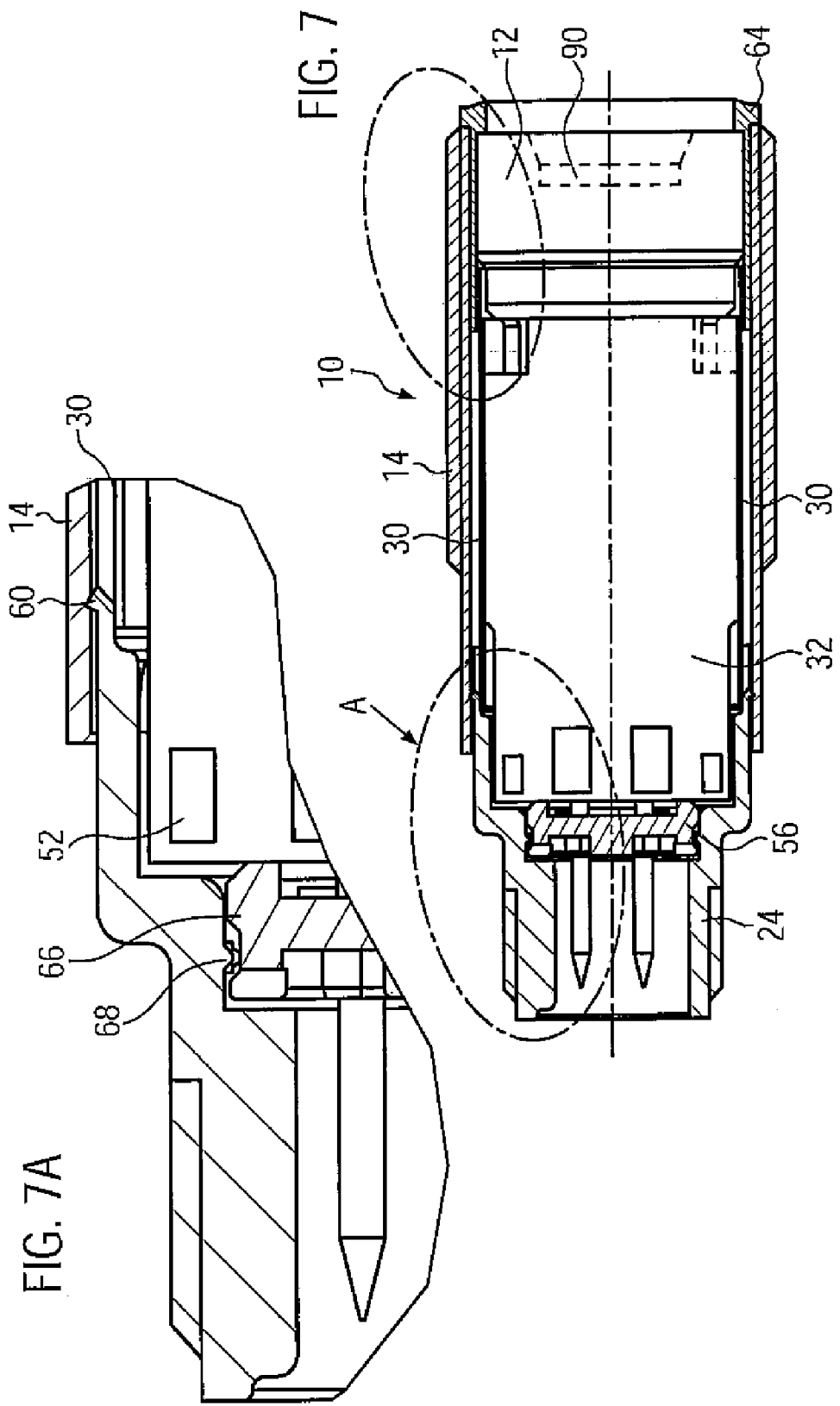

FIG. 7 In a sectional view a second embodiment of a switching device manufactured with the inventive method in accordance with single operation assembly from the measurement end to a connection part in the version for plugs, FIG. 7A showing detail A on a larger scale.

Figure 8:
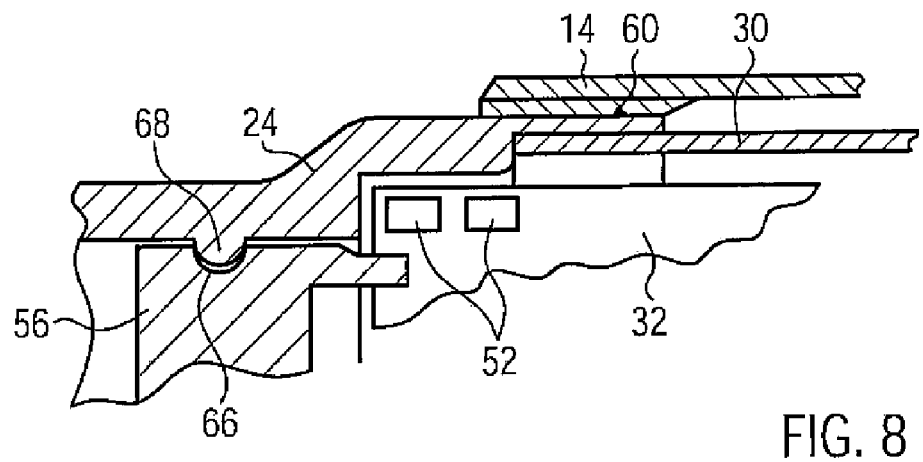

FIG. 8 A detail of the embodiment shown in FIG. 7.

Figure 9:
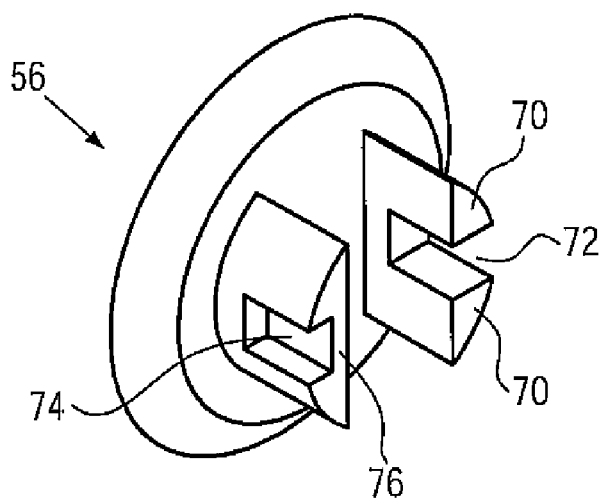

FIG. 9 A detail of a plug insert for a module according to the invention.

Figure 10:
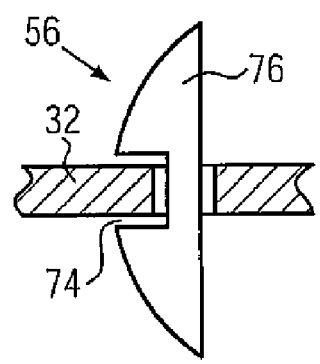

FIG. 10 A detail of the plug insert shown in FIG. 9.

Figure 11:
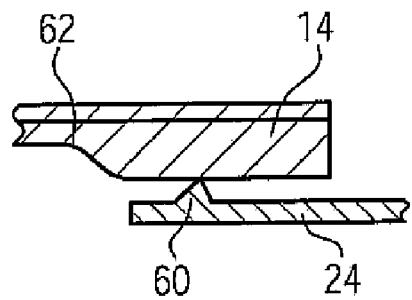
Figure 12:
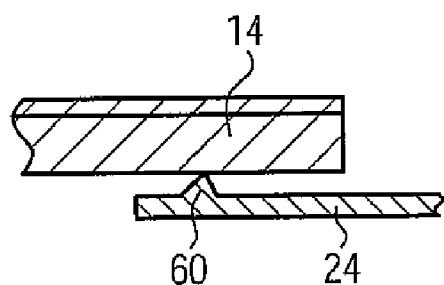

FIGS. 11 & 12 Details of a switching device manufactured according to the invention in the vicinity of the connection between the casing sleeve and connection part.

FIG. 13 Further details similar to the embodiment shown in FIG. 8.

FIG. 14 A variant of a connection part in a partial view.

FIG. 15 A sectional view of an embodiment of a switching device corresponding to assembly from the connection side with a connection part in the version for plugs and with an O-ring variant.

Figure 16:
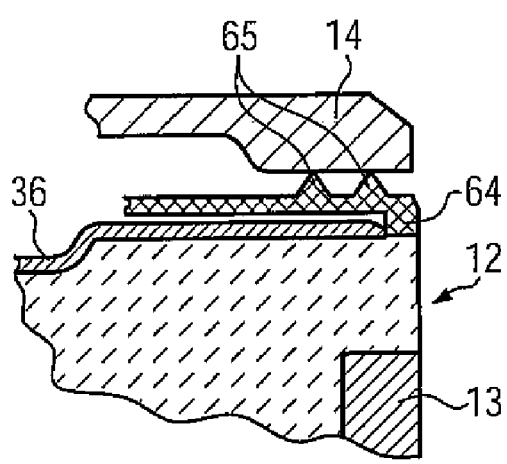

FIG. 16 Details of a switching device manufactured according to the invention in the vicinity of the connection between the casing sleeve and sensor unit.

The method according to the invention is explained relative to FIG. 1, which shows in exploded form together with a casing sleeve 14 a module 28, which can also be called an intermediate module. Module 28 is assembled from a sensor unit 12, a support 16 for an electronic circuit constructed as a printed circuit board 32, a shield 26 constructed as a shielding sleeve 30 and a connection part 24. These components are shoved together in the direction indicated by arrows 21 in FIG. 1 and in this way assembled to a finished module 28. Said module 28 is then inserted in the casing sleeve 14 from the measurement end 22 of the latter and as is implemented in the embodiments of FIGS. 2/3 or 7/8.

In principle, the casing sleeve 14, sensor unit 12 and/or connection part 24 can be shaped in such a way that the module 28 is inserted into the casing sleeve 14 from its rear end 20. Casing sleeve 14 can be made from metal and/or plastic, as is implemented also in the embodiment of FIG. 15.

Thus, the method according to the invention permits a single operation assembly of a complete, substantially completely rotationally symmetrically shielded, finished module 28 which is coaxially built up in the basic elements in an longitudinally elongated, cylindrical casing. Thus, compared with the prior art there is no need for a number of assembly steps.

In the embodiment of FIG. 1 the sensor unit and connection part 24, which can be constructed as a completely transparent and/or semitransparent end termination or plug insert, have a printed circuit board and/or shield-centring function. The longitudinally elongated, cylindrical shielding sleeve 30 is fitted in such a way that with respect to printed circuit board 32 and the casing sleeve 14 subsequently guided over the same an adequate insulation spacing is ensured, in order to respect the standards of proximity switch technology, e.g. EN 60947. In conjunction with the converter receptacle 64, the connection part 24 automatically centres module 28 in the cylindrical casing sleeve 14.

The manufacturing method is suitable for various constructions of the sensor units 12, which can also be referred to as converter receptacle 64 at the measurement end. It is in particular possible to use straight and angular converter receptacles, in which in each case it is possible to insert, independently of the measurement principle, random measuring converters or transducers. There are also vast variation possibilities regarding connection part 24. It is possible to use different connection parts 24, which can also be referred to as termination parts and/or end cap and/or transparent end termination. It is in particular possible to have connection parts with a cable departure or plug departure, without this essentially changing the manufacturing principle according to the invention, which essentially involves the measurement or termination-side insertion of a rigid module. This permits a more uniform manufacturing method, so as to reduce costs.

For the method and module 28 according to the invention particular significance is attached to the shielding sleeve 30, which is constructed as a cylindrical shielding sleeve for shielding against electromagnetic radiation for the support received therein with an electronic circuit. On both the measurement and connection sides the shielding sleeve 30 has an opening and is also characterized in that at least one contacting tab for the electronic circuits is randomly provided on the shielding sleeve circumference, but in a particularly advantageous development of the inventive device at the end and that at the end and on the measurement side is in each case provided in the sleeve body at least one slot-like recess.

Thus, the shielding sleeve 30 has a shielding function and at the same time provides mechanical cohesion for the rigid module 28. It also absorbs forces on inserting module 28 into casing sleeve 14.

The shielding against electromagnetic radiation, if this is necessary for the sensor principle, is particularly effective if the shielding sleeve 30 is combined with a subsequently described shielding cup 36 for sensor unit 12, because then a one-sided closed shielding tube is formed. It is also advantageous that through the shielding sleeve 30 the rigid module 28 acquires additional mechanical stability. The single operation assembly of the switching device, particularly the insertion of module 28 into casing sleeve 14 is also facilitated by the rigid shielding sleeve, because it is able to absorb forces occurring between sensor unit 12 and connection part 24. As a result the tongue-like areas 53 at the end of support recesses 54 (cf. FIG. 6) are not mechanically stressed, provided that they advantageously have a spacing between support 16 and the bottom wall of termination 24 for taking up manufacturing tolerances.

This shielding possibility is suitable for all standard cylindrical casing diameters in automation technology, particularly M12, M18 and M30, together with other diameters.

As a result of suitable insulation gaps, which can also be used for moulding and/or extruding with insulating material and for venting during moulding, the insulation strength of the sensor is defined. In this case the module 28 is centred by means of end termination 24 and the measurement-side converter shielding cup 64.

Electrical contacting and additional mechanical stability can be obtained through a solder or contacting tab. If the aforementioned moulding openings or slots or appropriately designed recesses have an adequate size, manual soldering of the contacting tab, even when module 28 is complete, is very simple.

The adequate size of the moulding openings and/or slots also permits a void-free moulding of the module with a moulding compound. Preferably use is made of a transparent and/or semitransparent premoulding and/or moulding compound, particularly if the connection part 24 contains lighting means, particularly in more than one segment and in particularly advantageous manner light-emitting diodes in four quadrants. Premoulding can bring about a better cohesion of the rigid module 28.

The moulding openings or slots or appropriately designed recesses in the shielding sleeve 30, apart from distributing the moulding compound in an insulating gap serve as a mechanical spring element, which can be pressed onto the measurement side-centring of the shielding advantageously in the form of a shielding cup and/or on a connecting element of the sensor unit 12 produced in such a manner.

An inner face of the casing sleeve 14, which is shown in FIG. 1 in a simple, completely turned construction without a step, serves as a sealing face for circumferential sealing lips of the in each case used transparent connection part 24 or for corresponding sealing devices of the respective sensor unit. These sealing devices are explained in greater detail hereinafter. The connection part 24 can be designed for at least one cable departure and/or a correspondingly constructed electrical and/or mechanical connection.

In a particularly advantageous development, the inner face of the casing sleeve 14 can have a taper, which serves to press once again a fully transparent, semitransparent or non-transparent end termination 24 or plug insert with at least one circumferential sealing lip, provided that the module 28 has almost completely been inserted in the casing sleeve 14.

Casing sleeve 14 can in particular have an external thread with all the standard sizes used in automation technology, i.e. M12, M18, M30, etc. or a similarly shaped cylindrical casing sleeve.

The casing sleeve 14 can also have a measurement or terminal-side stop for the rigid module 28. This stop can in particular come into engagement with an edge on the sensor unit 12 and/or on the termination 24 following the complete insertion of module 28. This leads to a precise definition of the switching device length.

A first embodiment of a switching device 10 manufactured according to the method of the invention is shown in the sectional views of FIGS. 2 and 3. Equivalent components are in each case given the same reference numerals.

A module 28 according to the invention is inserted from the measurement side 22 into a casing sleeve 14. The module 28 comprises a sensor unit 12 with a sensor 13, a support 16 constructed as a printed circuit board 32 and having an electronic circuit 18, a shield 26 constructed as a shielding sleeve 30 and a connection part 24. In the present embodiment the connection part 24 is constructed at the rear end 20 of the casing sleeve opposite to the measurement end 22 as a transparent connection part 24 with cable departure. By means of connecting lines 46, 48 for which suitable openings are provided in connection part 24 the electronic circuit 18 on printed circuit board 32 is connected to external equipment. Sensor unit 12 is provided with a shielding bush 36, which can also be called a shielding cup. In its bottom region, i.e. at the end opposite to the measurement end 22, this shielding bush 36 has a taper in which the shielding sleeve 30 engages both in electrically contacting and also mechanically stabilizing and centring manner. By means of a connecting line 44 sensor unit 12 is connected to electronic circuit 18. As shown in FIG. 4, electrical contacting of the shielding cup 36 relative to the printed circuit board 32 also takes place by means of contact tabs 38, connected to board 32 on either side, particularly by soldering.

A sectional view of the switching device 10, shown in FIGS. 2 and 3, in the direction of the rear end 20, i.e. in the direction of connection part 24 is shown in FIG. 5. In particular, it is possible to see therein the central arrangement of the printed circuit board 32 with respect to connection part 24. For the reception of the printed circuit board 32 in connection part 24 in the inner region there are guide grooves 82 and rail-like guides 84. The rail-like guides 84 are formed on the outsides of bushes 86. These bushes 86 are connected to passage openings 40, which are provided for filling with a moulding material the interior of switching device 10. Additionally, in the vicinity of the inlet openings of guide grooves 82 is provided an insertion and centring aid in the form of an outwardly increasingly widening opening. In the embodiment shown the cable departure is duplicated, i.e. there are passage openings 50 for two connecting lines. Correspondingly, there need only be one cable connection or if necessary there can be more than two connections. Passage openings 50 have a tooth system in scoring form in order to provide torsion and tension relief for the cables. The openings 50 also taper in the direction of the interior of switching device 10. This brings about a sealing towards the outside through the elastic cable jacket. Finally, thereby also a tension relief for the cable or cables is brought about in addition to the loop laying of the cable strands.

A simplified assembly of module 28, particularly the attachment of connection 24 to printed circuit board 32, is achieved in the cable variant of FIGS. 2 and 3 by spring tension, i.e. by the restoring force of the connecting lines introduced with tension relief loops and fixed to circuit board 32.

In the case of the cable variant of FIGS. 2 and 3 the cohesion of module 28 is ensured by the punctiform adhesive connection of connection 24 and shielding sleeve 30, as well as shielding sleeve 30 and cup-shaped bush 36, in each case at the radial outer edges of the elements to be connected.

A possible additional transparent and/or semitransparent premoulding or prebonding of the fully transparent and/or semitransparent connection part 24 for the cable and/or plug variant also aids the cohesion of module 28.

Moulding of the sensor interior can take place via openings 40, which can also be called moulding holes 40. In particular, via the recesses in the shielding sleeve 30, it is possible to carry out premoulding with a transparent and/or semitransparent moulding compound, particularly up to the level of bushes 86, which can also be called chimneys.

Moulding can be carried out as rising and/or vacuum moulding and/or by injecting thermosetting resins. Two moulding holes are required for filling and venting purposes in the case of gravity rising moulding. The moulding compound is passed into the interior through one or two bushes 86 or chimneys 86. The chimney-like construction shown permits premoulding with a transparent moulding compound for the at least one luminescent display and advantageously four-quadrant display. Insertion bevels or slopes for the circuit board 32 are once again provided on the outsides of bushes 86 for the rail-like guides 84. Only one moulding hole is required for vacuum moulding. Both moulding procedures can be implemented on the termination variant with at least one cable departure and/or with at least one device connection.

Since both with the connection parts 24 for plug insert and cable connection a diameter taper 37 is provided between the bottom of the connection part and extending up to the chimney-like bushes 86, which is only interrupted by the guide groove 82 with insertion bevel, in a particularly advantageous development of the invention and in conjunction with the rail-like guides 84, the printed circuit board 32 can be positioned in precisely defined manner in connection part 24. Through the insertion bevels on both sides of guide groove 82 the circuit board 32 in the case of an azimuth-faulty angular position on mounting said circuit board 32 the latter slides substantially independently on the diameter taper 37 into the guide grooves 82, by manually performing a slight relative rotation of termination 24 or circuit board 32. This considerably increases the ease and efficiency of manufacture.

A detail of printed circuit board 32 is shown in FIG. 6. In accordance with the internal dimensions of the shielding sleeve 30 used, the circuit board 32 is in the form of an elongated rectangle. On the represented face of said rectangle is introduced a roughly semicircular or rectangular or similarly marked recess 54, through which tongue-like areas 53 are formed respectively on the two edges. In said areas and on the top and/or bottom of the circuit board are respectively provided as lighting means at least one, but advantageously two or more light-emitting diodes 52 by means of which it is possible to supply to the exterior via a transparent connection part 24 a state display of the sensor or electrical switching device. The tongue-like areas 53 in the installation state engage with the guide grooves 82 described in connection with FIG. 5 and the rail-like guides 84 of connection part 24. Insertion is facilitated by the insertion and centring aids, as well as by the insertion bevels on bushes 86. Recess 54 also facilitates a compact introduction of sensor cables or the plug receptacle with a plug element 56. The tongue-like areas 53, which can also be called lugs, also permit a particularly good coupling out of light energy for the display, hereinafter only referred to as four-quadrant display, through the fully transparent or semitransparent connection part 24.

The fundamental novelty in the variant with cable departure is more particularly the combination of the very compact cable departure within the framework of the fully transparent and/or semitransparent connection part 24 and the maximum irradiation surface for the lighting means 52, particularly the light-emitting diodes. In the embodiment shown the arrangement of the light-emitting diodes together with the special shaping of the printed circuit board 32 is in the form of a multisegment display, particularly a two-segment display or four-quadrant display.

The lugs are unnecessary in the following variant of a connection part 24 with a fully transparent, semitransparent or nontransparent plug insert. The circuit board also has solder pads for at least one and in a particularly advantageous manner both contact tabs 38 of the shielding cup 36, as well as for at least one or several corresponding contact tabs of shielding sleeve 30.

A variant of an inventively manufactured switching device 10 with plug insert 56 in a locking version, where assembly takes place from the measurement side, is shown in FIG. 7 and on a larger scale with respect to detail A in FIG. 7A. Connection part 24 is here preferably in the form of a transparent plug receptacle with a plug element 56. Although a transparent material is preferred for the plug receptacle, use can also be made of a semitransparent or a non-transparent material.

The converter or transducer element 90 of sensor unit 12 is primarily axially oriented. However, it is also possible to use an angular sensor unit 12 with radiation substantially at an angle to the longitudinal axis, particularly approximately 90 Ø.

By means of its connection pins the plug element 56 can be soldered to the printed circuit board. Through the radial collar on the transducer receptacle 64 at the measurement-side end a stop is formed frontally with the casing sleeve and lip seals with respect to the inner circumferential wall of the casing sleeve 14 can be provided on the outer circumference of the transducer receptacle.

Further details with respect to detail A are also shown on a somewhat larger scale in the following FIG. 8.

A preferred possibility for the sealing in the case of an embodiment with plug element 56 is diagrammatically illustrated in FIG. 8, where a seal between connection part 24 and plug element 56 is provided by means of a circumferential bead 68 formed on the inside of connection part 24 and a corresponding circumferential groove 66 formed on the outside of plug part 56. The circumferential bead 68 can also be called a snap lip and seals the interior of the switching device 10, together with groove 66 in a hermetic manner. Said connection can in particular be formed as a click closure and also provides mechanical stability to the structure. As a result of the locking of the plug insert 56 connected in dimensionally stable manner to the circuit board with the associated end termination, in a particularly simple manner it is possible to achieve a dimensional stability of module 28 without any need for a premoulding and/or adhesive connection to shield 26.

In order to improve the mechanical stability of the thread and/or the break-off security, connection part 24 can also have for thread reinforcement purposes metal parts inserted in plastic. However, in a further advantageous development the connection part can comprise all-metal constructions with axially extended slots, which are implemented with transparent and/or semitransparent plastic windows, so that the metallic connection in the case of a given higher mechanical stability also permits the multisegment display. Thus, it is possible to construct an embodiment of connection part 24 in all-plastic and/or all-plastic with metal inserts and/or all-metal with transparent and/or semitransparent plastic inserts.

A substantially automatically correct positioning of circuit board 32 relative to plug element 56 and connection part 24 with a fitting stud for external equipment connections such as e.g. bushes, can be implemented by suitable shaping of plug element 56 combined with the insertion mechanism according to FIG. 5 with an inventive design of guide grooves 83 and rail-like guides 84, which fix the positioning of circuit board 32 in the connection part and is described relative to FIGS. 9 and 10.

Asymmetrically shaped fitting studs 70, 76 are provided on a side of plug part 56 facing the inside of switching device 10. Whereas fitting stud 70 has a continuous coding slot 72, the facing fitting stud 76 is provided with an only outwardly open coding slot 74. In the case of a correspondingly shaped printed circuit board 32, the latter can only engage in the coding slots 72, 74 in a specific orientation. The positive engagement of a partial area of circuit board 32 with the half-open coding slot 74 on fitting stud 76 is shown diagrammatically in a sectional view in FIG. 10.

The four quarter-cylindrical fitting studs 70, 76 projecting from plug element 56 guide the printed circuit board 32 in the intermediate slots 72, 74. Coding stud 76 engages in recess 54 of board 32. As a result plug element 56 is clearly oriented with respect to connection part 24, because the latter is clearly oriented by guide slots 82 and rail-like guides 84 relative to circuit board 32. In an advantageous development of the invention there is no need for the coding slot 74 if there is a solid fitting stud 76. Then a somewhat wider recess 54 is required on circuit board 32. In a further advantageous development of the invention there is no need for recess 54 if a visibly projecting coding stud pairing similar to the fitting studs 70 is only located over one side or surface of circuit board 32, i.e. asymmetrically and/or is clearly appropriately marked and during assembly it is visually ensured that the correct coding exists.

At the ends of a circuit board the fully transparent connection part 24 can receive more than a single heterochromatic light-emitting diode, which is a major advantage of the design, because it ensures quasi all-round visibility. It is also important in the plug variant of switching device 10, that the manufacturing method is exactly the same as for the cable variant. Here also, all the mechanical elements are built up coaxially through the fully transparent connection part 24 prior to the final assembly of module 28 and centred in casing sleeve 14.

As a result of the described coding for plug element 56 a protection against twisting is also obtained. As described hereinbefore in conjunction with the variant of connection part 24 as a cable departure, also in the embodiment shown of a plug connection part corresponding moulding holes can be provided. The number of connection pins can be varied. In particular in the case of four connection pins there can be provided a central moulding hole or in the case of five plug pins at least one eccentric moulding hole. The connection part 24 e.g. constructed as a fully transparent plug insert can also be given an external thread for receiving connectors.

FIGS. 11 and 12 show details of the connection between connection part 24 and casing sleeve 14. To obtain a sealing connection, which also leads to additional mechanical stability, at least one circumferential sealing lip 60 can be provided on a outside of connection part 24.

In the embodiment of FIG. 11 the casing sleeve 14 has a taper 62, which as a function of the insertion direction of module 28, is on the measurement or connection side, so as to permit a pressing of the plastically deformable sealing lips or sealing units as soon as module 28 is almost completely inserted.

In the case of the one operation assembly of module 28 from the measurement-side end of casing sleeve 14, the axially frontally directed surface of casing sleeve 14 serves as a stop for module 28 with the widened radius of the transducer receptacle 64. In this case, the taper in casing sleeve 14 is located at the connection-side end.

A particularly advantageous variant of a connection part 24 will be described with reference to FIGS. 13 and 14. An embodiment with a plug insert 56 is shown. This embodiment is also possible with the previously described cable departure.

The connection part 24 has an elongated collar or insulating collar 42, which in the case of an assembled switching device extends substantially over the entire axial length of the shielding sleeve 30 and completely fills the space between shielding sleeve 30 and casing sleeve 14, which can also be called an insulating gap. This leads to a very high dielectric strength and operating safety, particularly the respecting of protection class 2, provided that a corresponding dimensioning is made possible by the external diameter. This also prevents water penetration. On insulating collar 42 is provided a conical overlap 80 with shielding bush 36 or an underlap with the cylindrical transducer receptacle 64 which is slid under a cylindrical branch of transducer receptacle 64 of sensor unit 12. During final assembly the insulating collar 42 can be optionally bonded to the casing sleeve 14. Circumferential sealing lips 78 hermetically seal the interior of the adhesive joint of switching device 10 and also ensure an additional, non-positive cohesion between casing sleeve 14 and connection part 24. A centring of shielding sleeve 30, circuit board 32 and module 28 with respect to the casing sleeve 14 can be obtained by means of a centring in connection part 24 and the elongated collar. In the manner described hereinbefore in conjunction with FIGS. 9 and 10 here again there is a coding of circuit board 32, so that it can only be introduced into the plug element 56 in a clearly defined manner. The diameters of the components are such that the fully transparent plug insert 24 can be pushed through the casing sleeve 14. The connection part 24 constructed as a plug insert can also be constructed as a multisegment, particularly two-segment or four-quadrant LED display. A bead formed in connection part 24 prevents an inclined insertion of printed circuit board 32 and a twisting of connection part 24.

Apart from a higher dielectric strength, the longitudinally elongated insulating collar 42 also makes much more difficult the penetration of water through expansion gaps in the case of material stressing with varying temperatures. The elongated insulating collar 42 overlaps at overlap point 43 with sensor unit 12. Optionally the insulating collar 42 must be bonded to the casing sleeve 14.

In the case of the plug variants of FIGS. 7, 8 and 13, module 28 is held together by circumferential bead 68 and circumferential groove 66 in plug insert 56.

A variant of an inventively manufactured switching device 10 with plug insert with assembly from the connection side is shown in FIG. 15. The connection part 24 is constructed as a transparent plug receptacle with a plug element 56, sealing being provided by an O-ring 58. As in the embodiments of FIGS. 1 to 6, the coverage area of the sensor unit 12 extends axially. However, it is also possible for there to be an incorporation of angular sensor units 12, e.g. with a coverage range at right angles to the longitudinal axis of casing sleeve 14. Plug element 56 can be soldered by means of its connection pins to printed circuit board 32.

FIG. 16 shows details of the connection of sensor unit 12 to casing sleeve 14. There again, to provide a sealing connection, on an outside of a bush-like transducer receptacle 64 there are circumferential sealing lips 65 engaging with the inside of casing sleeve 14.

In the case of the single operation assembly of module 28 from the connection-side end of casing sleeve 14, the axially frontally directed surface of the casing sleeve 14 serves as a stop for module 28 with the extended radius of termination 24. The taper in the casing sleeve 14 is at the measurement-side end (cf. FIG. 16).

In the method according to the invention, the following method steps are to be carried out in the manufacture of a switching device with cable departure. Firstly the sensor unit 12 is preassembled. Then the sensor unit 12 is soldered by means of contact tabs 38 to printed circuit board 32 in an auxiliary device and simultaneously board 32 is centred relative to sensor unit 12. The connection lines 46, 48 are then drawn through the transparent connection part 24 and the cylindrical shielding sleeve 30 is drawn onto the cables.

The cable ends of connecting lines 46, 48 are then soldered to circuit board 32. This is followed by the testing and adjustment of the sensor, because the electronics are still accessible at this stage. The shielding sleeve 30 is then drawn over the sensor electronics. Front-side centring and manual pressing of the shielding sleeve 30 takes place by means of the shielding cup 36 located over the straight or angled sensor unit 12. During this the contacting tab of shielding sleeve 30 is in equal maner manually rotary oriented on the existing solder pad.

The connection part 24 can then be engaged and, while doing so, it is manually possible to centre and code in one step the shielding sleeve 30 and the circuit board 32 with lighting means 52 through insertion and centring aids in connection part 24. Through the correspondingly generously constructed opening or recess shielding sleeve 30 can then be contacted/soldered to circuit board 32 and then premoulding of the transparent connection part 24 can take place if necessary through said openings, which in this case serve as moulding openings 40.

Module 28 is then slid into the cylindrical casing sleeve 14. This can be followed by moulding, foaming or plasticizing, e.g. with thermosetting resins. Optionally there can be no filling of the otherwise mechanically hermetically sealed switching device, particularly if the module is adhesively connected to the outer sleeve 14.

During the manufacture of the connector variant, following the soldering of the sensor unit 12 to circuit board 32, the pins of plug element 56 are soldered to board 32. As stated, plug element 56 has a circumferential groove 66, in which can be firmly locked a bead 68 of connection part 24 during sliding over and then the shielding sleeve 30 is slid on. A front-side centring and manual pressing and orientation of the contacting tab of shielding sleeve 30 once again take place by means of the shielding cup 36 of sensor unit 12.

Connection part 24 is then slid on and once again the printed circuit board 32 is centred and optionally coded through the insertion and centring aid in connection part 24. During the engagement of the connection part bead 68 locks in groove 66 of plug element 56. This permits a mechanically slightly flexible fixing of shielding sleeve 30 with circuit board 32. In this way module 28 is in particularly advantageous manner inherently stable without having to use adhesives during preassembly of said module 28. Furthermore, a hermetic plug-side sealing of the interior of the switching device is made possible through the engagement of bead 68 in groove 66. Alternatively this point is sealed by an O-ring. Then the now also bilaterally centred shielding sleeve 30 is soldered through the moulding opening in shielding sleeve 30, as described hereinbefore for the cable departure solution. After inserting module 28 into the cylindrical casing sleeve 14, the interior of the switching device can optionally be moulded, foamed or plasticized.

Both methods apply equally when the connection 24 with elongated collar 42 is constructed for the cable and plug variant.

In the manufacturing method of the switching device with single operation assembly from the connection side, all the method steps described hereinbefore relative to the plug variant apply.

However, in this case the insertion of the complete module 28 takes place from the connection side until the radial stop face of connection part 24 engages against the rear face of casing sleeve 14.

The invention claimed is:

1. Method for the manufacture of a switching device having a sensor unit located at a measurement end of a casing sleeve and connected to an electronic circuit placed on a support received in the casing sleeve and
    with a connection part located on a rear end of the casing sleeve,
    wherein
    the sensor unit, the support and the connection part together with a shielding sleeve surrounding the support for shielding electromagnetic radiation are assembled to form a dimensionally stable module,
    the module is subsequently inserted into the casing sleeve where it is received in fixing manner and
    the shielding sleeve is electrically connected to the support.

2. Method according to claim 1,
    wherein
    the module is introduced into the casing sleeve from the measurement end.

3. Method according to claim 1,
    wherein
    the module is introduced into the casing sleeve from the rear end.

4. Method according to claim 1,
    wherein
    the module is sealingly inserted into the casing sleeve.

5. Method according to claim 1,
    wherein
    use is made of a cylindrical shielding sleeve and a cylindrical casing sleeve.

6. Method according to claim 1,
wherein
the support is constructed as a printed circuit board and is brought into aligned engagement with the sensor unit and the circuit board is electrically connected to sensor unit.

7. Method according to claim 6,
wherein
before the sensor unit is connected to the electronic circuit on the printed circuit board, it is placed in a cup-like shielding bush.

8. Method according to claim 7,
wherein
contact tabs provided on the shielding bush are soldered to the printed circuit board.

9. Method according to claim 1,
wherein
the shielding sleeve, surrounding the support in a clearly defined manner, is brought into engagement with the sensor unit.

10. Method according to claim 1,
wherein
the shielding sleeve is oriented in a defined coaxial manner to the sensor unit and the casing sleeve.

11. Method according to claim 1,
wherein
a premoulding is performed with respect to the module in the connection part.

12. Method according to claim 11,
wherein
the premoulding is carried out with a material which is transparent or semitransparent after curing.

13. Method according to claim 11,
wherein
moulding takes place through at least one opening in the connection part.

14. Method according to claim 1,
wherein
a connection part with at least one cable departure is used.

15. Method according to claim 1,
wherein
a connection part with at least one plug departure is used.

16. Method according to claim 1,
wherein
the connection part is brought into a clearly defined orientation with the support on a terminal area of the shielding sleeve.

17. Method according to claim 1,
wherein
the connection part is oriented in a defined coaxial manner to the casing sleeve and the shielding sleeve.

18. Method according to claim 1,
wherein
the areas between the support and the shielding sleeve and between the shielding sleeve and the casing sleeve are moulded.

19. Method according to claim 1,
wherein
use is made of a connection part with an elongated collar, which is engaged over the shielding sleeve and engaged with the sensor unit.

20. Method according to claim 19,
wherein
the elongated collar is oriented coaxially to the casing sleeve and the shielding sleeve.

21. Method according to claim 19 or 20,
wherein
the elongated collar with a transducer receptacle forms an underlap or a defined stop.

22. Method according to one of the claims 19 or 20,
wherein
the module is retained with respect to the casing sleeve by a means selected from the group of means consisting of moulding, extruded thermosetting resins, and adhesive joints.

23. Module for a switching device for installation in a casing sleeve, having a sensor unit with a sensor for detecting a measurement signal, having an electronic circuit placed on a support, which is dimensionally stably connected at a measurement end to the sensor unit and in which the circuit is electrically connected to the sensor unit,
with a shielding sleeve electrically connected to the support and surrounding the latter for shielding electromagnetic radiation, which is connected in a dimensionally stable manner to at least one component selected from the group of components consisting of the sensor unit and the support, and
with a connection part for the connection of the circuit to external equipment placed on at least one component selected from the group of components consisting of the support and the shielding sleeve.

24. Module according to claim 23,
wherein
the sensor is a sensor selected from the group consisting of inductive, optical, capacitive, temperature, pressure and gas sensors.

25. Module according to one of the claims 23 or 24,
wherein
the sensor unit is provided with at least one component selected from the group of components consisting of a shielding bush and unit mechanically centring shielding bush.

26. Module according to claim 23,
wherein
the support is constructed as a printed circuit board.

27. Module according to claim 23,
wherein
the connection part has an elongated collar, which engages with the sensor unit.

28. Module according to claim 23,
wherein
spaces between the support and the shielding sleeve are moulded with an insulating material.

29. Module according to claim 23,
wherein
the sensor unit has a transducer receptacle with an axial arrangement of a measuring transducer or an angular arrangement of a measuring transducer.

30. Module according to claim 23,
wherein
the end termination for a cable variant and for a plug variant are constructed as replaceable modules.

31. Module according to claim 23,
wherein
spaces between the support and the shielding sleeve are extruded with an insulating material.

* * * * *